United States Patent
Setsuhara et al.

(10) Patent No.: US 8,931,433 B2
(45) Date of Patent: Jan. 13, 2015

(54) PLASMA PROCESSING APPARATUS

(75) Inventors: Yuichi Setsuhara, Suita (JP); Akinori Ebe, Kyoto (JP); Eiji Ino, Uji (JP); Shinichiro Ishihara, Takatsuki (JP); Hajime Ashida, Kyoto (JP); Akira Watanabe, Yokohama (JP)

(73) Assignee: EMD Corporation, Shiga (JP)

( * ) Notice: Subject to any disclaimer, the term of this patent is extended or adjusted under 35 U.S.C. 154(b) by 805 days.

(21) Appl. No.: 12/742,604

(22) PCT Filed: Nov. 12, 2008

(86) PCT No.: PCT/JP2008/003288
§ 371 (c)(1),
(2), (4) Date: May 12, 2010

(87) PCT Pub. No.: WO2009/063629
PCT Pub. Date: May 22, 2009

(65) Prior Publication Data
US 2010/0263797 A1 Oct. 21, 2010

(30) Foreign Application Priority Data
Nov. 14, 2007 (JP) ................................. 2007-296118

(51) Int. Cl.
*C23C 16/505* (2006.01)
*C23C 16/503* (2006.01)
(Continued)

(52) U.S. Cl.
CPC .............. *C23C 16/503* (2013.01); *C03C 17/22* (2013.01); *C23C 16/24* (2013.01); *C23C 16/509* (2013.01);
(Continued)

(58) Field of Classification Search
CPC ...................................... H01J 37/321–37/32183
USPC ........... 156/345.48, 345.49, 723 I; 118/723 I, 118/723 IR, 723 AN; 315/111.51
See application file for complete search history.

(56) References Cited

U.S. PATENT DOCUMENTS 5,449,880 A 9/1995 Takaki
5,565,738 A * 10/1996 Samukawa et al. ...... 315/111.51
(Continued)

FOREIGN PATENT DOCUMENTS

JP U 1-60528 4/1989
JP A 2-39422 2/1990
(Continued)

OTHER PUBLICATIONS

Jul. 23, 2012 Office Action issued in Chinese Patent Application No. 200880115393.3 (with translation).
(Continued)

*Primary Examiner* — Keath Chen
*Assistant Examiner* — Aiden Lee
(74) *Attorney, Agent, or Firm* — Oliff PLC

(57) ABSTRACT

The present invention aims at providing a plasma processing apparatus for performing a plasma processing on a planar substrate body to be processed, the apparatus being capable of generating the plasma with good uniformity and efficiently using the plasma, and having a high productivity. That is, the plasma processing apparatus according to the present invention includes: a vacuum chamber; one or plural antenna supporters (plasma generator supporters) projecting into the internal space of the vacuum chamber; radio-frequency antennas (plasma generators) attached to each antenna supporter; and a pair of substrate body holders provided across the antenna supporter in the vacuum chamber, for holding a planar substrate body to be processed.

12 Claims, 1 Drawing Sheet

(51) Int. Cl.
  *C03C 17/22* (2006.01)
  *C23C 16/24* (2006.01)
  *C23C 16/509* (2006.01)
  *H01J 37/32* (2006.01)

(52) U.S. Cl.
  CPC ........... *H01J 37/321* (2013.01); *H01J 37/3211* (2013.01); *C03C 2217/28* (2013.01); *C03C 2218/153* (2013.01)
  USPC .................................. 118/723 I; 156/345.48

(56) References Cited

U.S. PATENT DOCUMENTS

| | | | | |
|---|---|---|---|---|
| 6,155,199 | A | * | 12/2000 | Chen et al. ................... 118/723 I |
| 6,719,876 | B1 | * | 4/2004 | Ueda et al. ............... 156/345.48 |
| 6,755,150 | B2 | | 6/2004 | Lai et al. |
| 2004/0113287 | A1 | * | 6/2004 | Kishimoto et al. ... 257/E21.133 |
| 2005/0103443 | A1 | * | 5/2005 | Ishii ......................... 156/345.48 |
| 2005/0115504 | A1 | * | 6/2005 | Ueda et al. ................ 118/723 R |

FOREIGN PATENT DOCUMENTS

| | | |
|---|---|---|
| JP | A 5-283343 | 10/1993 |
| JP | A 2000-58297 | 2/2000 |
| JP | A 2001-35697 | 2/2001 |
| JP | A 2001-297899 | 10/2001 |
| JP | A 2007-262541 | 10/2007 |
| WO | WO 2007/111028 A1 | 10/2007 |

OTHER PUBLICATIONS

Jul. 23, 2012 Notification of Examination Opinion issued in Chinese Patent Application No. 200880115393.3.
Aug. 25, 2011 Office Action issued in Chinese Patent Application No. 200880115393.3 (with translation).
Setsuhara, "Meter-Scale Large-Area Plasma Sources for Next-Generation Processes," *Journal of Plasma and Fusion Research*, vol. 81, No. 2, Feb. 2005, pp. 85-93 (with abstract).
Takagi et al., "Array Antenna-shiki Daimenseki VHF-PCVD Sochi," *Oyo Butsuri*, vol. 71, No. 7, Jul. 2002, p. 874-877.
International Search Report for International Application No. PCT/JP2008/003288 dated Dec. 16, 2008 (with translation).
International Preliminary Report on Patentability for International Application No. PCT/JP2008/003288 dated Jun. 29, 2010 (with translation).
Office Action dated Apr. 9, 2013 issued in Japanese Patent Application No. 2007-296118 (with translation).
Office Action dated Feb. 27, 2013 issued in Chinese Patent Application No. 200880115393.3 (with translation).
Jun. 19, 2014 Taiwanese Office Action issued in Taiwan Patent Application No. 97143834 (with translation).

* cited by examiner

PLASMA PROCESSING APPARATUS

TECHNICAL FIELD

The present invention relates to a plasma processing apparatus for generating a plasma and for performing, by using the plasma, a deposition process, etching process, or other processes onto a planar substrate body to be processed.

BACKGROUND ART

Plasma processing apparatuses are widely used for manufacturing semiconductor substrates, substrates for a photovoltaic cell, substrates for a display, and other substrates. In order to obtain a substrate for a photovoltaic cell, for example, a silicon-containing plasma is generated above the surface of a glass substrate to deposit a silicon thin film on the glass substrate. Hereinafter, a substrate to which a plasma process is performed will be referred to as a "substrate body to be processed." (In the aforementioned example, the glass substrate corresponds to the substrate to be processed.)

In recent years, the size of various substrates as previously mentioned has been growing. Such substrates require to be evenly processed all over the surface of one substrate. In the case of a substrate for a photovoltaic cell, for example, one substrate is divided into a plurality of cells. The quality of each cell, such as the thickness of the silicon thin film, must be within a predetermined and limited range. Therefore, it is required that the density distribution of the plasma generated in a plasma processing apparatus should be within a given range, irrespective of the growth in the size of substrate bodies to be processed, or the growth in the size of the plasma production area.

The method of plasma processing apparatuses includes: an electron cyclotron resonance (ECR) plasma method, a microwave plasma method, an inductively coupled plasma method, a capacitively coupled plasma method, and otherwise, For example, Patent Document 1 discloses an inductively-coupled plasma processing apparatus in which a spiral induction coil is placed on the upper surface of the ceiling outside a vacuum chamber. In an inductively coupled plasma processing apparatus, gas is introduced into a vacuum chamber, and a radio-frequency electric current is applied to a radio-frequency antenna (or induction coil) to generate an induction electric field inside the vacuum chamber. This induction electric field accelerate electrons, and then the electrons collide with the gas molecules, so that the gas molecules are ionized to generate a plasma. The plasma processing apparatus described in Patent Document 1 requires an increase in the size of the spiral coil with the growth in the size of substrates. However, simply increasing the size of the spiral coil only increases the difference of the plasma density between the central part and the peripheral part. Accordingly, the criterion of the uniformity over all the surface as previously described cannot be met. In addition, increasing the size of an antenna lengthens the conductor of the antenna, which might form a standing wave in the antenna to create an inhomogeneous intensity distribution of the radio-frequency electric current, resulting in a possible inhomogeneous plasma density distribution (refer to Non-Patent Document 1).

Patent Document 2 and Non-Patent Document 1 disclose multi-antenna inductively coupled plasma processing apparatuses in which a plurality of radio-frequency antennas are attached to the inner walls of a vacuum chamber. In these apparatuses, the plasma distribution in the vacuum chamber can be controlled by appropriately setting the arrangement of the plurality of antennas. In addition, the length of the conductor of each antenna can be short, which can prevent the adverse effect due to the standing wave. For these reasons, the plasma processing apparatuses disclosed by Patent Document 2 and Non-Patent Document 1 can generate a plasma having high uniformity, compared with previous apparatuses.

[Patent Document 1] Japanese Unexamined Patent Application Publication No. 2000-058297 ([0026]-[0027] and FIG. 1)

[Patent Document 2] Japanese Unexamined Patent Application Publication No. 2001-035697 ([0050] and FIG. 11)

[Non-Patent Document 1] Setsuhara Yuichi, "Meter-Scale Large-Area Plasma Sources for Next-Generation Processes," Journal of Plasma and Fusion Research, vol. 81, no. 2, pp. 85-93, February 2005

DISCLOSURE OF THE INVENTION

Problem to be Solved by the Invention

The plasma processing apparatuses described in Patent Document 2 and Non-Patent Document 1 can increase the uniformity of the density of the plasma inside the vacuum chamber. However, approximately one half of the generated plasma diffuses not toward the center of the vacuum chamber, but toward the inner walls to which the antennas are attached, without being used for a plasma process. In addition, in a plasma chemical vapor deposition (CVD) apparatus for depositing materials onto a substrate body to be processed, approximately one half of the radicals (or film precursor) generated by a plasma attach to the inner walls of the vacuum chamber and form particles, which may fall down to cause the deterioration of the quality of a film. This gives rise to the necessity of a periodic cleaning of the inside of the vacuum chamber, which decreases the utilization ratio of the apparatus. Moreover, the necessity of the use of a large amount of expensive gas for cleaning increases the running cost.

Moreover, if the criterion for the uniformity of the processing quality (e.g. deposition thickness and density) all over the surface of the substrate body to be processed is tightened while the size of substrate bodies to be processed increasingly grows, the uniformity of a plasma must be further increased.

The problem to be solved by the present invention is to provide a plasma processing apparatus for performing a plasma process onto a planar substrate body to be processed, the apparatus being capable of generating a plasma having a high usage efficiency with a good uniformity, moderating the cost, and having a high productivity.

Means for Solving the Problem

To solve the previously described problem, the present invention provides a plasma processing apparatus, including:
a) a vacuum chamber;
b) a plasma generator supporter projecting into the internal space of the vacuum chamber;
c) a plasma generator attached to the plasma generator supporter; and
d) a pair of substrate body holders provided across the plasma generator supporter inside the vacuum chamber, for holding a planar substrate body to be processed.

The plasma generator generates a plasma by ionizing gas molecules in the vacuum chamber, Although a variety of configurations are possible for the plasma generator, a typical example is a radio-frequency antenna. Also, a microwave waveguide with a slit or slits, a radio-frequency electrode, or otherwise can be used as the plasma generator, In the present invention, the "plasma generator supporter projecting into the internal space" includes a plasma generator supporter which longitudinally (or laterally) extends through the internal space, Effects of the Invention In the plasma processing apparatus according to the present invention, the plasma generator is attached to the plasma generator supporter projecting into the internal space of the vacuum chamber. Therefore, the total area of the parts to which the plasma generator is attached can be small, compared to the case where the plasma generator (or a radio-frequency antenna) is attached to the inner wall of the vacuum chamber as in the plasma processing apparatuses described in Patent Document 2 and Non-Patent Document 1. This increases the use efficiency of plasma, and decreases the amount of the materials to attach to the inner walls of the vacuum chamber in a plasma CVD apparatus. Consequently, the frequency of cleaning the inner walls can be decreased, which increases the operation ratio of the apparatus and suppresses the running cost.

In the present invention, the use of the plasma generator supporter allows the plasma generators to be attached to any position in the internal space. Therefore, the placement of the plasma generators is not limited to the area surrounding the internal space as in the case of Patent Document 2 or Non-Patent Document 1, but can be extended to around the center of the internal space. Hence, the plasma generators can be more evenly arranged than ever before all over a large-area planar substrate body to be processed, such as a substrate for a semiconductor apparatus, a substrate for a photovoltaic cell, or a substrate for a display. This enables the formation of a plasma with higher uniformity in a larger space than ever before. Accordingly, a plasma process such as an etching and a deposition processing can be performed with high uniformity all over the large-area substrate body to be processed.

Furthermore, in the present invention, the use of the pair of substrate body holders, each for holding a planar substrate body to be processed, enables a simultaneous processing of two planar substrate bodies. This can bring about higher productivity than ever before. In addition, since the planar substrate bodies are arranged at both sides of the plasma generator supporter, the amount of the plasma consumed on the inner walls of the vacuum chamber is smaller than in the case where only one planar substrate body is placed. Accordingly, the amount of the wasted plasma can be further reduced, enhancing the use efficiency of the energy and resource.

The plasma processing apparatus of the present invention can be preferably used to produce a silicon thin film on a glass substrate (substrate body to be processed) for a photovoltaic cell.

In recent years, silicon thin films for photovoltaic cells need to be produced on a glass substrate having a side length of more than 1 m. Conventional plasma processing apparatuses other than those of a multi-antenna system require the use of an antenna as long as the size of such a substrate. In that case, a use of a commonly used radio-frequency of 13.56 MHz might form a standing wave on the antenna conductor, possibly causing a fluctuation of the plasma density in the vacuum chamber. In the multi-antenna system, on the other hand, since the conductor of each antenna is shorter than conventional antennas, the formation of a standing wave can be assuredly prevented.

As previously described, the present invention, which employs the multi-antenna system, enables the formation of the plasma with higher uniformity in a larger space. Therefore, it is possible to produce a silicon thin film for a photovoltaic cell having higher quality in the uniformity of the film thickness and other respects and having a larger area.

EXPLANATION OF NUMERALS

10 . . . Plasma Processing Apparatus
11 . . . Vacuum Chamber
111 . . . Internal Space
12 . . . Antenna Supporter (Plasma Generator Supporter)
13 . . . Radio-Frequency Antenna (Plasma Generator)
14 . . . Power Supply
15 . . . Impedance Matcher
16 . . . Substrate Body Holder
21 . . . Planar Substrate Body To Be Processed

BEST MODE FOR CARRYING OUT THE INVENTION

Figure 1:
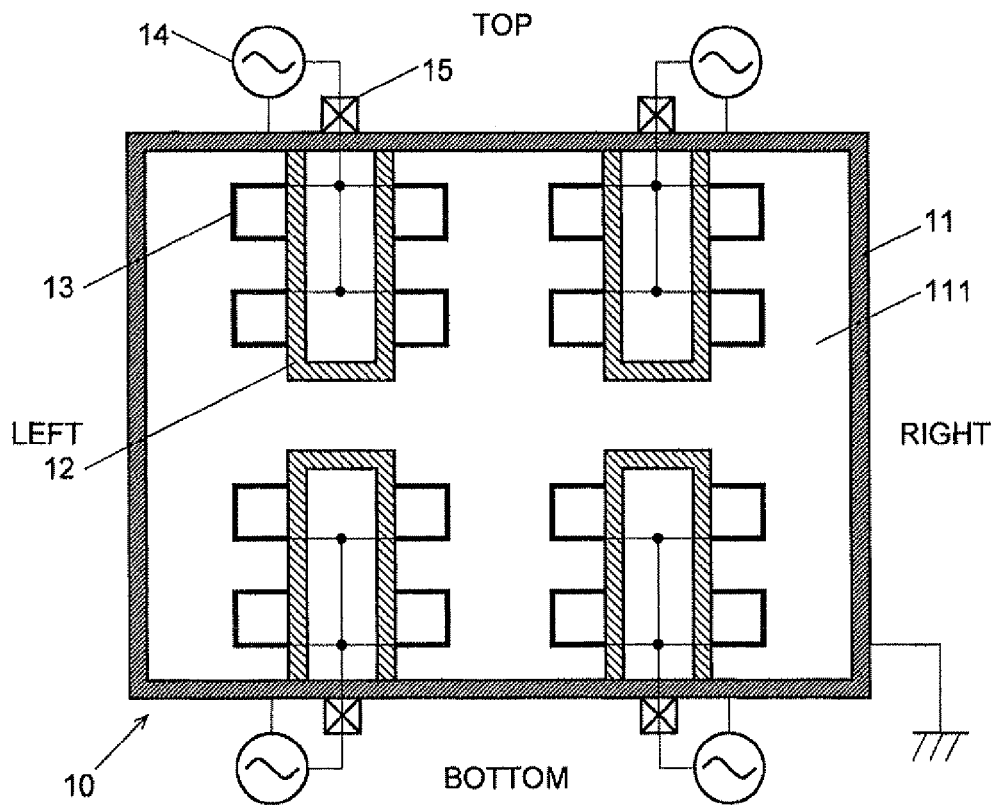
FIG. 1 is a longitudinal sectional view of an embodiment of the plasma processing apparatus according to the present invention.

An embodiment of the plasma processing apparatus according to the present invention will be described with reference to FIGS. 1 and 2. The plasma processing apparatus according to the present invention is for processing a large-area planar body to be processed. Hence, processes are performed while the planar body to be processed is held in an upright position in order to prevent the planar body to be processed from bending.

The plasma processing apparatus 10 of the present embodiment has a vacuum chamber 11 which is the same as the conventional ones. As shown in FIG. 1, four antenna supporters (or plasma generator supporters) 12 project from the upper side and lower side of the vacuum chamber 11 to the inside of its internal space 111. Each antenna supporter 12 has four radio-frequency antennas (or plasma generators) 13, and in total 16 radio-frequency antennas 13 are provided in the vacuum chamber 11. Accordingly, in the plane of FIG. 1 (which will be referred to as the "antenna arrangement plane"), 16 radio-frequency antennas 13 are arranged at approximately equal intervals both vertically and horizontally. Each of the radio-frequency antennas 13 is a rectangular planar antenna in which a linear conductor is bent at a right angle at two points, and is so placed that its plane is in the antenna installation plane.

Each antenna supporter 12 has the shape of a thin rectangular parallelepiped, with a hollow space within. In the present embodiment, a power supply 14 is provided for each antenna supporter 12, and the radio-frequency antennas 13 attached to each antenna supporter 12 are connected in parallel to the power supply 14. For every power supply 14, an impedance matcher 15 is provided between the power supply 14 and the radio-frequency antennas 13. The wiring connecting the impedance matcher 15 and each radio-frequency antenna 13 is placed inside the hollow space of the antenna supporter 12. The hollow space of the antenna supporter 12 may communicate with the vacuum chamber 11, or may communicate with the outside (or atmosphere).

Figure 2:
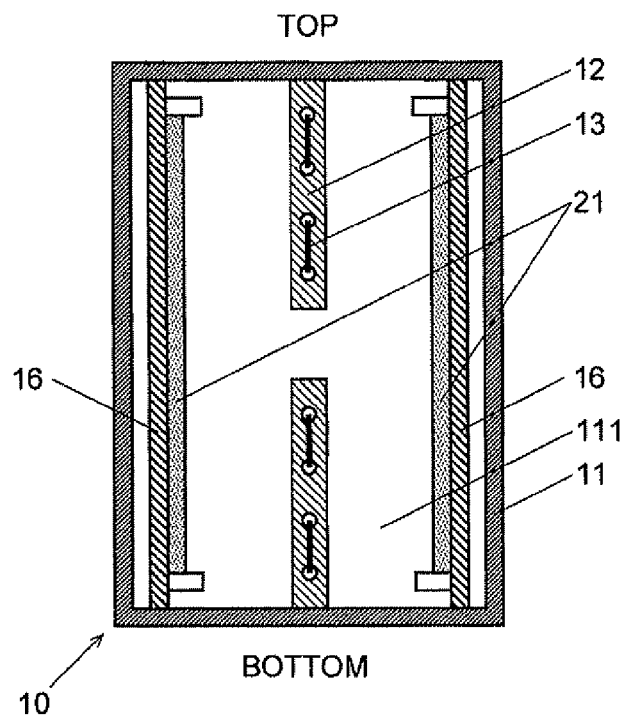
FIG. 2 shows a longitudinal section orthogonal to the section of FIG. 1, according to the plasma processing apparatus of the present embodiment.

As illustrated in FIG. 2, two substrate body holders 16 are provided across the radio-frequency antenna 13 and the antenna supporter 12. Each substrate body holder 16 vertically holds one planar substrate body to be processed 21. Accordingly, both the planar substrate bodies to be processed 21 are parallel to the antenna installation plane and the planes of the radio-frequency antennas 13, allowing this plasma processing apparatus 10 to be thinner.

In addition, a vacuum pump for evacuating the internal space 111, a gas introduction port for introducing a plasma source gas, and other units are provided in the plasma processing apparatus 10.

The operation of the plasma processing apparatus 10 of the present embodiment will be described, taking a case where a silicon thin film for a photovoltaic cell is produced on a glass substrate as an example. First, glass substrates (planar substrate bodies to be processed) 21 are each attached to both the substrate body holders 16. Next, after the internal space 111 is evacuated by the vacuum pump, a mixed gas of silane and hydrogen is introduced as a plasma source gas from the gas introduction port. Then, a radio-frequency power with a frequency of 13.56 MHz is supplied from the power supply 14 to the radio-frequency antennas 13 to generate a plasma in the vacuum chamber 11. Consequently, plasma molecules, which are the ionized molecules of the plasma source gas, deposit on the glass substrate, forming a silicon thin film.

In the plasma processing apparatus 10 of the present embodiment, since the radio-frequency antennas 13 are attached to the antenna supporter 12, the placement of the radio-frequency antennas 13 can be extended to around the center of the apparatus 10. This allows the formation of a plasma having further higher uniformity, compared to the conventional case where the radio-frequency antennas are provided only on the inner walls of the vacuum chamber. Further, since the area of the portions to which antennas are attached can be relatively small, the loss of the plasma which moves to the side where the antennas are attached can be reduced, compared to the case where the radio-frequency antennas 13 are attached to the walls of the vacuum chamber 11.

The arrangement of two planar substrate bodies to be processed 21 across the antenna supporter 12 enables a plasma process to simultaneously take place on the two planar substrate bodies to be processed 21, which enhances the production efficiency. Since the plasma processing of these two planar substrate bodies to be processed 21 proceeds under substantially the same conditions, the two planar substrate bodies 21 after the process has little difference in quality. Furthermore, since both the plasmas generated at both sides of the planar radio-frequency antennas 13 are used to process the planar substrate bodies to be processed 21, the plasma use efficiency and the energy efficiency can be further enhanced. At the same time, since the amount of the plasma that reaches the inner walls of the vacuum chamber 11 is smaller than in the case of processing only one planar substrate body to be processed 21, the amount of the wasted plasma can be further reduced, enhancing the use efficiency of the energy and resource.

The plasma processing apparatus according to the present invention is not limited to the apparatus of the aforementioned embodiment.

For example, although the number of antenna supporters 12 is two in the present embodiment, it may be only one, or may be more than two, in accordance with the shape, size, and other features of the substrate body to be processed. The number of radio-frequency antennas 13 to be attached to one power supply 14 and the number of power supplies 14 to be used in the entire apparatus can be appropriately determined, taking into consideration the power consumption of the radio-frequency antennas 13 and other factors. The radio-frequency antennas 13 may have a planar shape formed by a linear conductor bent in a U-shape, semicircular shape, or any other shapes, other than the aforementioned rectangular shape.

In the aforementioned embodiment, the planar radio-frequency antennas 13 are arranged parallel to the planar substrate bodies to be processed 21. However, the planar radio-frequency antennas may be obliquely arranged relative to the planar substrate bodies to be processed 21.

In the aforementioned embodiment, the substrate body holders 16 vertically hold the planar substrate bodies to be processed 21. However, the planar substrate bodies to be processed 21 may be slightly inclined from the vertical position, or may be held in a direction other than the vertical position: e.g. in a horizontal position.

The invention claimed is:

1. A plasma processing apparatus, comprising:
    a) a vacuum chamber;
    b) a pair of substrate body holders provided in the vacuum chamber for holding two planar substrate bodies to be processed in parallel;
    c) a plurality of plasma generator supporters provided between the pair of substrate body holders, wherein the plurality of plasma generator supporters project from a wall of the vacuum chamber in a direction parallel to the planar substrate bodies to be processed; and
    d) each of the plurality of plasma generator supporters comprising a plasma generator comprising a plurality of radio-frequency antennas that are attached to an individual plasma generator supporter and placed on a same plane parallel to the planar substrate bodies to be processed, wherein
    for each of the plurality of plasma generator supporters, at least one first radio-frequency antenna is attached to a first side of the individual plasma generator supporter and at least one second radio-frequency antenna is attached to the individual plasma generator supporter on a second side that is opposite to the first side of the individual plasma generator supporter.

2. The plasma processing apparatus according to claim 1, wherein at least one of the plurality of radio-frequency antennas is a planar radio-frequency antenna comprising a linear conductor bent in a plane, and the planar radio-frequency antenna is disposed substantially parallel to the planar substrate body to be processed.

3. The plasma processing apparatus according to claim 2, wherein the substrate body holder is for holding the planar substrate body to be processed in an upright position.

4. The plasma processing apparatus according to claim 3, wherein the substrate body holder is for holding a glass substrate for a photovoltaic cell.

5. The plasma processing apparatus according to claim 2, wherein the substrate body holder is for holding a glass substrate for a photovoltaic cell.

6. The plasma processing apparatus according to claim 1, wherein the substrate body holder is for holding the planar substrate body to be processed in an upright position.

7. The plasma processing apparatus according to claim 6, wherein the substrate body holder is for holding a glass substrate for a photovoltaic cell.

8. The plasma processing apparatus according to claim 1, wherein the substrate body holder is for holding a glass substrate for a photovoltaic cell.

9. The plasma processing apparatus according to claim 1, wherein the plurality of radio-frequency antennas are attached to the plasma generator supporter so that the plurality of radio-frequency antennas project in a direction perpendicular to a direction in which the plasma generator supporter projects from the wall of the vacuum chamber.

10. The plasma processing apparatus according to claim 9, wherein each of the plurality of radio-frequency antennas is a planar shape antenna.

11. The plasma processing apparatus according to claim 10, wherein the planar shape antenna is a U-shape antenna.

12. The plasma processing apparatus according to claim 1, wherein
- the at least one first radio-frequency antenna is a plurality of first radio-frequency antennas that are attached to the first side of an individual plasma generator supporter,
- the at least one second radio-frequency antenna is a plurality of second radio-frequency antennas that are attached to the individual plasma generator supporter on the second side that is opposite to the first side of the individual plasma generator supporter,
- each of the plurality of first radio-frequency antennas that are attached to the first side of the individual plasma generator supporter are spaced apart from each other, and
- each of the plurality of second radio-frequency antennas that are attached to the second side of the individual plasma generator supporter are spaced apart from each other.

* * * * *